(12) United States Patent
Hanna et al.

(10) Patent No.: US 10,599,797 B1
(45) Date of Patent: Mar. 24, 2020

(54) SYSTEM, METHOD, AND COMPUTER PROGRAM PRODUCT FOR GROUPING ONE OR MORE FAILURES IN A FORMAL VERIFICATION

(71) Applicant: Cadence Design Systems, Inc., San Jose, CA (US)

(72) Inventors: Nizar Hanna, Karmeil (IL); Kanwar Pal Singh, Noida (IN); Maayan Ziv, Haifa (IL); Sudeep Kumar Srivastava, Noida (IN); Tamer Mograbi, Mazraa (IL); Sanaa Halloun, Isfya (IL)

(73) Assignee: Cadence Design Systems, Inc., San Jose, CA (US)

(*) Notice: Subject to any disclaimer, the term of this patent is extended or adjusted under 35 U.S.C. 154(b) by 45 days.

(21) Appl. No.: 15/832,279

(22) Filed: Dec. 5, 2017

(51) Int. Cl.
*G06F 17/50* (2006.01)

(52) U.S. Cl.
CPC .................. *G06F 17/504* (2013.01)

(58) Field of Classification Search
CPC ..................................................... G06F 17/504
USPC ......................................................... 716/106
See application file for complete search history.

(56) References Cited

U.S. PATENT DOCUMENTS

| 8,302,050 B1* | 10/2012 | Hollander | G06F 11/26 716/106 |
| 2007/0079266 A1* | 4/2007 | Devineni | G06F 17/5081 716/112 |
| 2014/0258954 A1* | 9/2014 | De | G06F 17/504 716/113 |
| 2014/0351775 A1* | 11/2014 | Alfieri | G06F 17/5022 716/102 |

* cited by examiner

Primary Examiner — Suresh Memula
(74) Attorney, Agent, or Firm — Mark H. Whittenberger, Esq.; Holland & Knight LLP

(57) ABSTRACT

The present disclosure relates to a method for use in a formal verification of an electronic design. Embodiments may include providing, using at least one processor, an electronic design and performing linting analysis using structural and formal methods of at least a portion of the electronic design. Embodiments may also include identifying a plurality of failures from the formal verification and identifying one or more of the plurality of failures as having a similar root cause. Embodiments may include grouping the one or more of the plurality of failures together, wherein grouping is based upon, at least in part, a check type.

17 Claims, 4 Drawing Sheets

SYSTEM, METHOD, AND COMPUTER PROGRAM PRODUCT FOR GROUPING ONE OR MORE FAILURES IN A FORMAL VERIFICATION

FIELD OF THE INVENTION

The present disclosure relates to electronic design verification, and more specifically, to a method for grouping one or more failures in a formal verification.

DISCUSSION OF THE RELATED ART

Formal verification relies upon a system of constraints to communicate the legal state space to the proof engines. Prelayout design rule checking, sometimes referred to as linting, may produce many checks out of which a large number of violations might be reported. Designers are often unhappy with the large number of violations that such tools report and would like the tools to filter noise more adequately.

SUMMARY OF DISCLOSURE

In one or more embodiments of the present disclosure, a computer-implemented method for use in a formal verification of an electronic design is provided. The method may include providing, using at least one processor, an electronic design and performing linting analysis using structural and formal methods of at least a portion of the electronic design. The method may also include identifying a plurality of failures from the formal verification and identifying one or more of the plurality of failures as having a similar root cause. The method may include grouping the one or more of the plurality of failures together, wherein grouping is based upon, at least in part, a check type.

One or more of the following features may be included. In some embodiments, the method may include displaying the grouping at a graphical user interface. The plurality of failures may include at least one linting failure. A similar root cause may correspond to a portion of code. The check type may include a source location. Displaying may include displaying an icon indicating the grouping. Displaying may include displaying at least one of the one or more of the plurality of failures at an analysis browser.

In one or more embodiments of the present disclosure a computer-readable storage medium having stored thereon instructions, which when executed by a processor result in one or more operations is provided. Operations may include providing, using at least one processor, an electronic design and performing linting analysis using structural and formal methods of at least a portion of the electronic design. Operations may also include identifying a plurality of failures from the formal verification and identifying one or more of the plurality of failures as having a similar root cause. Operations may include grouping the one or more of the plurality of failures together, wherein grouping is based upon, at least in part, a check type.

One or more of the following features may be included. In some embodiments, operations may include displaying the grouping at a graphical user interface. The plurality of failures may include at least one linting failure. A similar root cause may correspond to a portion of code. The check type may include a source location. Displaying may include displaying an icon indicating the grouping. Displaying may include displaying at least one of the one or more of the plurality of failures at an analysis browser.

In one or more embodiments of the present disclosure, a system for electronic design verification is provided. The system may include one or more processors configured to receive, using at least one processor, an electronic design, the at least one processor further configured to perform linting analysis using structural and formal methods of at least a portion of the electronic design, the at least one processor further configured to identify a plurality of failures from the formal verification and to identify one or more of the plurality of failures as having a similar root cause, the at least one processor further configured to group the one or more of the plurality of failures together, wherein grouping is based upon, at least in part, a check type.

One or more of the following features may be included. In some embodiments, the at least one processor may be configured to display the grouping at a graphical user interface. The plurality of failures may include at least one linting failure. A similar root cause may correspond to a portion of code. The check type may include a source location. Displaying may include displaying an icon indicating the grouping. Displaying may include displaying at least one of the one or more of the plurality of failures at an analysis browser.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
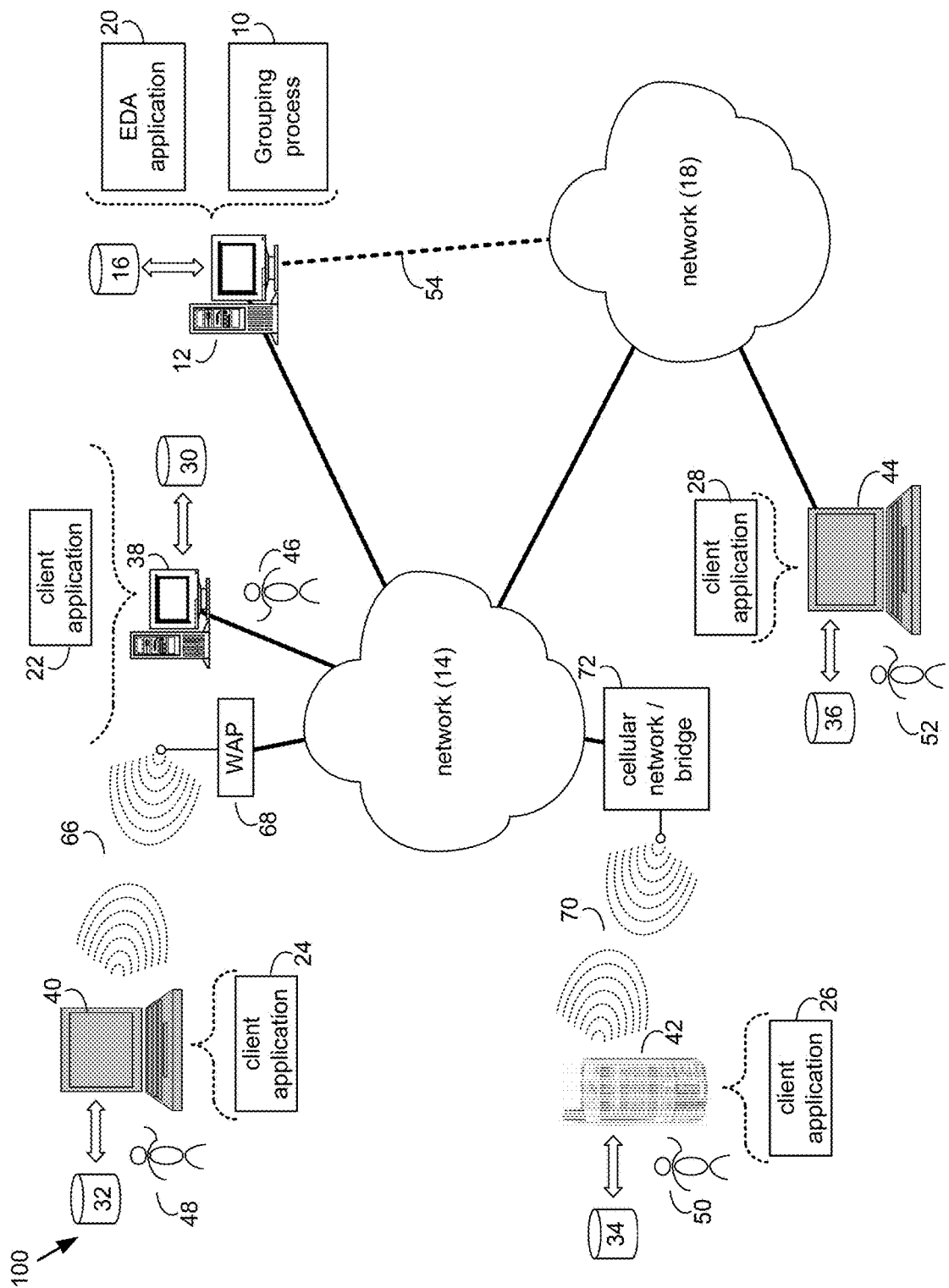
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a grouping process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, grouping process 10 may reside on and be executed, in whole or in part, by a client electronic device, such as a personal computer, notebook computer, personal digital assistant, or the like.

The instruction sets and subroutines of grouping process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Web server is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Grouping process 10 may be a stand alone application, or may be an applet/application/script that may interact with and/or be executed within EDA application 20. In addition/as an alternative to being a server-side process, grouping process 10 may be a client-side process (not shown) that may reside on a client electronic device (described below) and may interact with an EDA client application (e.g., one or more of EDA client applications 22, 24, 26, 28). Further, grouping process 10 may be a hybrid server-side/client-side process that may interact with EDA application 20 and an EDA client application (e.g., one or more of client applications 22, 24, 26, 28). As such, grouping process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize grouping process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
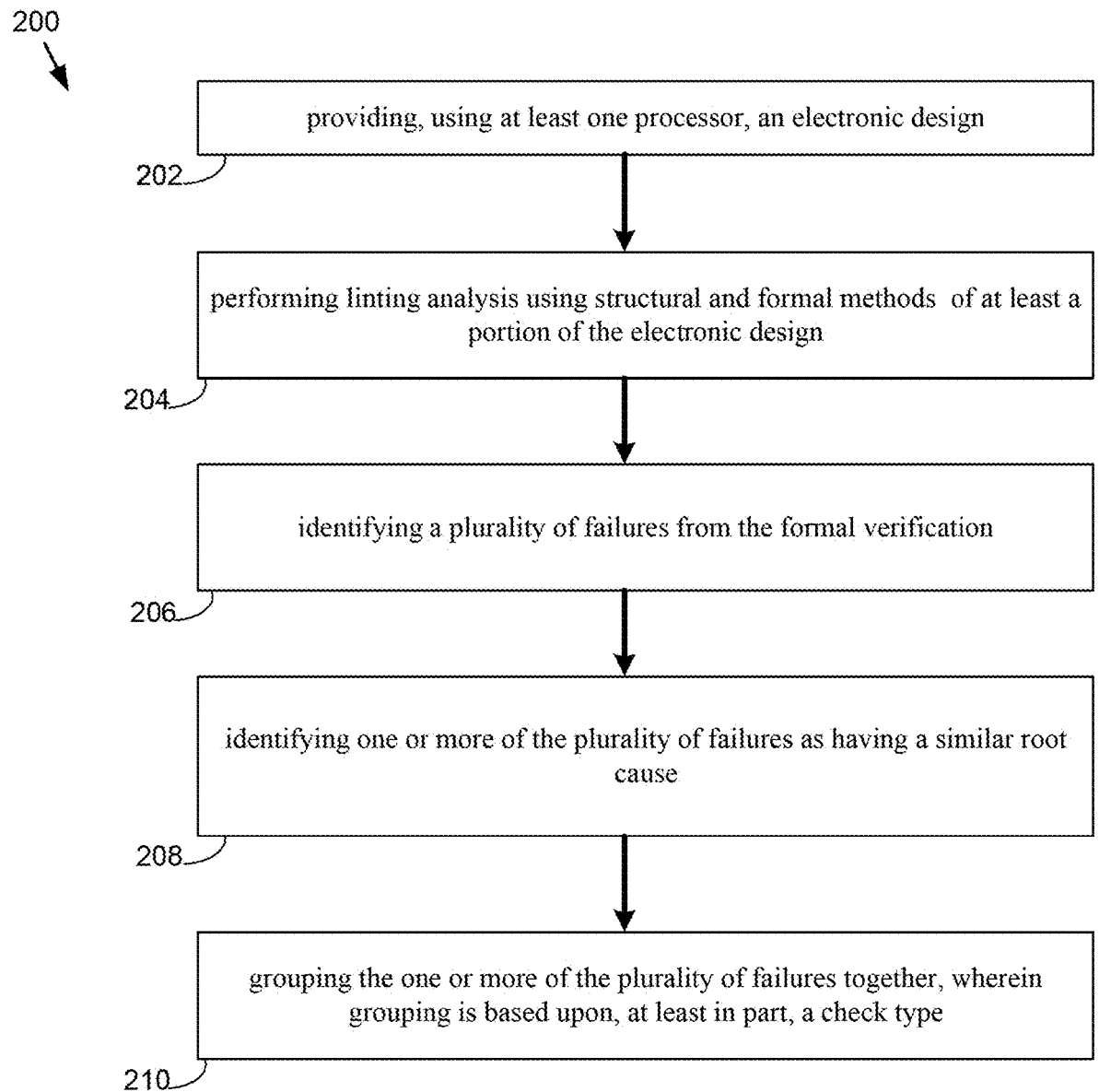
FIG. 2 is a flowchart depicting operations consistent with the grouping process in accordance with an embodiment of the present disclosure.

Referring now to FIG. 2, an exemplary flowchart 200 depicting operations consistent with grouping process 10 is provided. Operations may include providing (202), using at least one processor, an electronic design and performing (204) linting using structural methods and formal verification methods of at least a portion of the electronic design. Operations may also include identifying (206) a plurality of failures from the linting using structural methods and formal verification methods and identifying (208) one or more of the plurality of failures as having a similar root cause. The method may include grouping (210) the one or more of the plurality of failures together, wherein grouping is based upon, at least in part, a check type. In some embodiments, this may be across different check types, based on root cause analysis and leverage formal verification for linting.

As discussed above, prelayout design rule checking, sometimes referred to as linting, may produce many checks out of which a large number of violations might be reported. Designers are often unhappy with the large number of violations that such tools report and would like the tools to filter noise more adequately. Some checks may include, but are not limited to, arithmetic checks, out of bound indexing, x-assignment unreachability, naming convention checks, clock checks, reset checks, DFT checks, etc. Any arithmetic check may be used in accordance with this disclosure, some of which may include, but are not limited to, a MUX, selector, AND, OR, NAND, NOR gate, etc.

Embodiments of grouping process 10 may employ root cause based violation grouping. Accordingly, grouping process 10 may attempt to group a set of violations that are related and with a high probability might have be related to the same root cause. For example, failures which are in same source location or area are better to be grouped, the assumption is that when a user is looking at one failure in this area he/she may fix others that are noticed while debugging. Some examples of root causes may include, but are not limited to, structural root cause—deadcode, FSM state unreachability, FSM transition unreachability, etc. In some cases, some or all of these checks might fail for the same reason indicating that this specific FSM branch is unreachable. Additionally and/or alternatively, and with regard to structural lint and formal checking, in linting there is a check for potential arithmetic overflow, and in formal verification there is another check which verifies formally the overflow. These are also candidates to be grouped.

In this way, grouping process 10 may be configured to suggest one representative of the group to be debugged and fixed. This should significantly reduce the total analysis and debugging time. In this way, the teachings of the present disclosure may be used to present failures and allow for debugging the representative of the group only (with a high probability of fixing other group members as well). In contrast, existing techniques present the failures as a flat list and ask the user or designer to analyze them all.

Currently, when running a linting tool the user might receive hundreds or even thousands of violations. Many of those violations are not real and he or she will need to review all and waive many.

For example, many violations might originate from the same problem and the same line of code from different instances across a generate loop. Moreover, having an unreachable state in an FSM while turning on one or more checks (e.g., FSM state unreachability, FSM transition Unreachability, Deadcode check, stuck at signal check, etc.).

In some embodiments, a stuck-at signal check may confirm that RTL logic elements are never stuck at a constant value. An FSM reachable state check may confirm that a FSM state is reachable from the initial FSM state. FSM transitions checks may confirm that a transition from one state to the next state is possible. A dead code check may confirm that the RTL is reachable. Dead code checks may be generated for the following constructs: if, if-else statement, loop (block property generated for a for/while looping) statement, case_default (block property generated for the default branch of a case), case (block property generated for one of the non-default), branches of the case statement, cond_assign (block property generated for ternary operator (?) in Verilog or when-else in VHDL).

One example for such a grouping with those check types is provided below:

```
// combinational block
always @ (ps or din)
begin:
    ....
    case (ps)
        s0: begin
            ns =s1
        end
        s1: begin
            if (din == 1'b0)
        ---→       ns = s2;
            else
                ns = s0;
        end
        s2: begin
            if (din == 1'b1)
                ns = s1;
            else
                ns = s0;
        end
    endcase
```

If we assume that the line highlighted with the arrow above is unreachable, then the deadcode check will fail as this line is unreachable, the FSM state reachability will fire as state S2 is unreachable and the FSM transition check will fire as s1 to s2 state transition is unreachable. The tool may then group all those 3 failures and show only one. Accordingly, fixing it will fix all the others.

Using existing approaches this would lead the tool to report 4-5 violations that have the same root cause. In contrast, reducing those by showing only one (e.g., transition unreachability) would be very beneficial for the user, investing less time by analyzing and fixing one violation which may result in a fix of the remaining violations as well.

Figure 3:
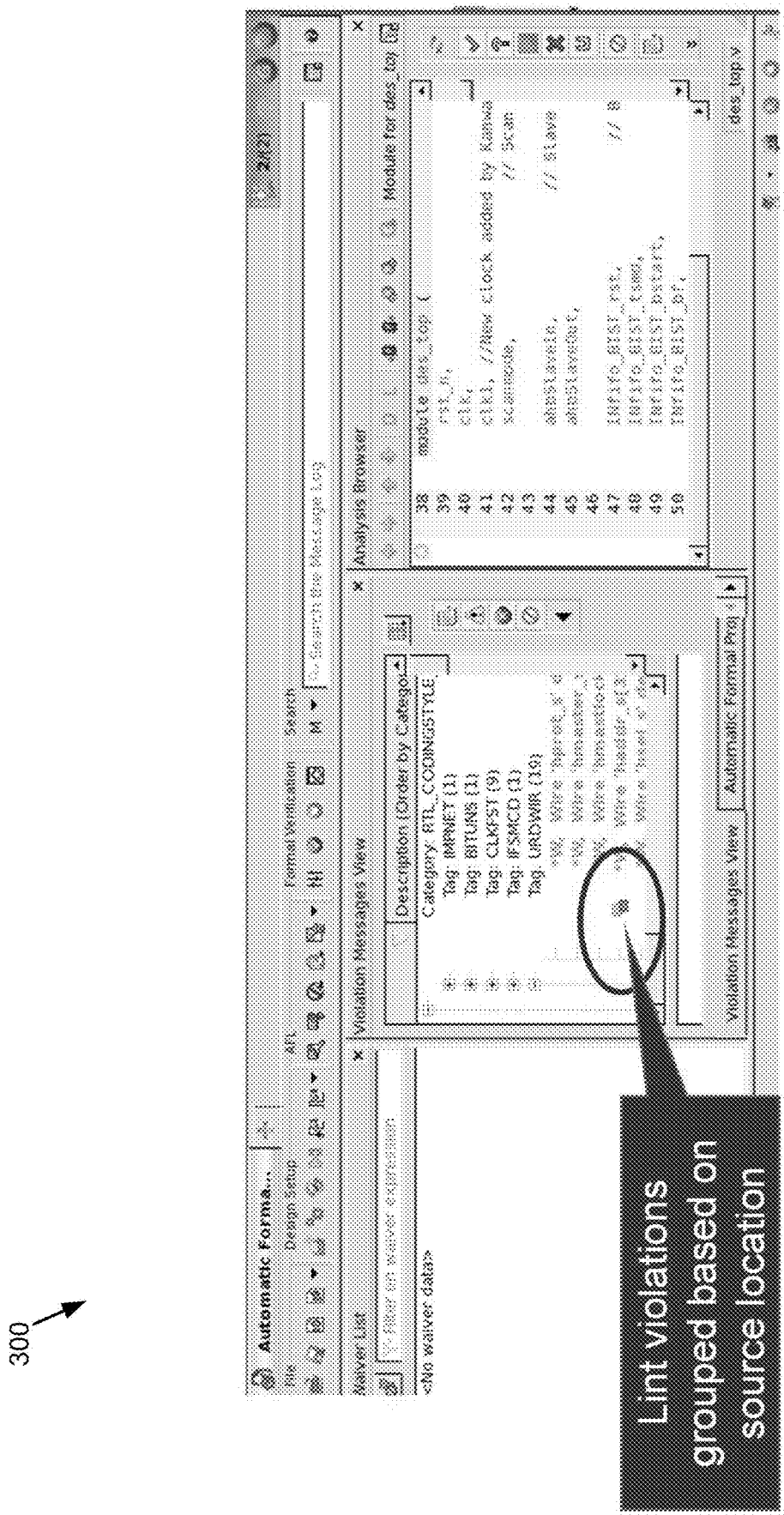
FIG. 3 is an example of a graphical user interface consistent with the grouping process in accordance with an embodiment of the present disclosure.
Figure 4:
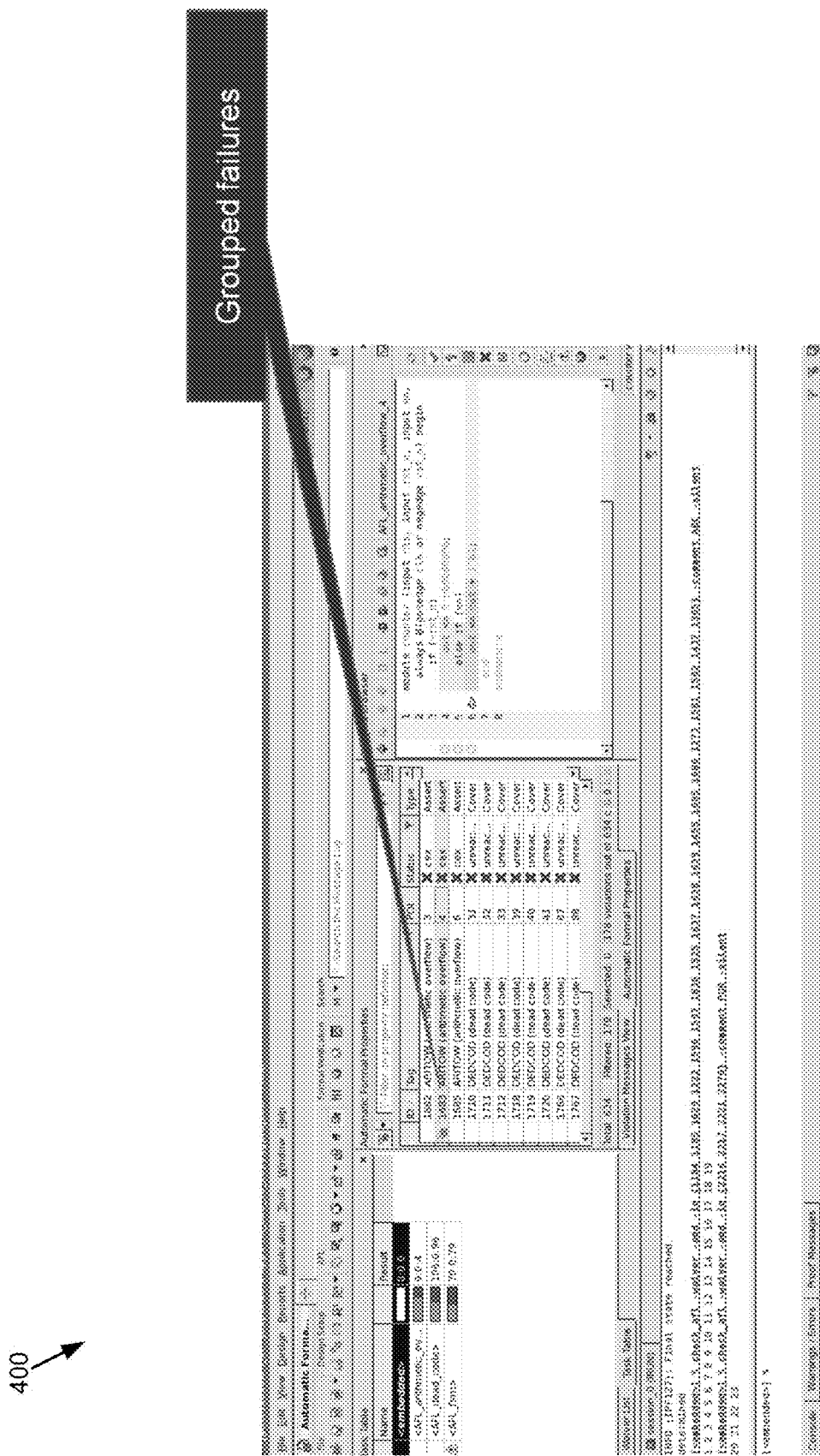
FIG. 4 is an example of a graphical user interface consistent with the grouping process in accordance with an embodiment of the present disclosure.

Referring also to FIGS. 3-4, embodiments of grouping process 10 may be configured to present only one representative from the group with a special icon indicating one or more grouping violations. In some embodiments, the group may be identified based on some heuristics to try and reduce the user analysis time while obtaining the same value.

Referring again to FIG. 3, an embodiment consistent with grouping process 10 is provided. FIG. 3 provides a graphical user interface 300 that shows lint violations that may be grouped based upon certain checks. FIG. 3 is showing the violation view layout of the tool where it presents all failures of structural and formal checks all together, this is the default view for designer. In this example, source location. In some embodiments, the grouping algorithm may be configured in any suitable way, for example, by grouping across instances, source location, etc.

In some embodiments, the grouping may occur across different check types. For example, check types may include FSM state reachability, and the check type deadcode. In this way, if both are referring to the same branch in code then grouping these together is logical. As such, if the user fixes the FSM state unreachability it would also fix the dead code failure.

Referring again to FIG. 4, an embodiment consistent with grouping process 10 is provided. FIG. 4 provides a graphical user interface 400 that shows an example of violation grouping. FIG. 4 depicts the same grouping but over the formal view layout, this layout is focused on formal checks only and used by formal experts.

Accordingly, grouping process 10 may be configured to group one or more failures having a similar root cause to improve designer productivity and reduce the failures shown by default. In some instances, fixing one violation may result in fixing multiple, and often, all violations.

In some embodiments, the grouping may be performed across different check types, for example, one approach is to group any checks with a contained source location. Accordingly, for each violation grouping process 10 may be configured to create a signature that contains the source location data and unify all similar signatures into one group. Selecting may be performed at random, or may be based on the highest ranked.

Currently, tools are reporting violations as a flat list, wherein grouping process 10 may be performed for the same check when repeated on different instances. Embodiments of grouping process 10 may extend grouping for even different checks based on some root cause analysis heuristics as explained above.

In some embodiments, grouping process 10 may provide the user with a reduced list of violations that he/she is required to analyze. If he fixes those there may be a high probability that the other violations in the group will be also fixed, if any do remain, they may be addressed in another iteration.

As discussed above, linting and formal linting tools generate many violations for designers which often include excessive noise. In many circumstances the violations may be related and/or connected and, as such, it may be helpful to address these violations in an incremental way. Accordingly, in some embodiments, analyzing the first introduced violations and resolving them may contribute to identifying and resolving the rest of violations which may be hidden in the first incremental view. This approach may lead to a huge reduction in total debugging and analysis invested time by the user.

Existing approaches do not provide a useful way to lead the user to smart incremental analysis and debugging. Embodiments of grouping process 10 may provide a smart way of analyzing relations and root causes of failures and violations. Additionally, and/or alternatively, these may be presented to the user in various displays. For example, the highest ranked violations while hiding other violations, which may be related and/or connected. In operation, the user by fixing this subset of violations may contribute to fixing many of the rest that may have been hidden in the first report. The remaining may appear in the next run.

In some embodiments, and referring again to FIGS. 3-4, the incremental violation view may direct and lead the user as to where to properly begin the analysis. Moreover, the user may then invest his/her time first on a subset of violations, and incrementally look on the rest of violations from which a large amount might be resolved by those previous resolutions. With this approach his/her total analysis and debugging time should highly be reduced.

It should be noted that the EDA application and processes described herein may utilize, in whole or in part, linting tools that may perform both structural linting as well as formal linting. Additionally and/or alternatively, the grouping of failures may be across different checks types including structural and formal, etc. The grouping may also leverage the formal methods to group structural failures that may be related.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for use in a formal verification of an electronic design comprising:
   providing, using at least one processor, an electronic design;
   performing linting analysis using structural and formal methods of at least a portion of the electronic design;
   identifying a plurality of failures from the formal verification;
   identifying one or more of the plurality of failures as having a similar root cause;
   grouping the one or more of the plurality of failures together, wherein grouping is based upon, at least in part, a check type; and
   displaying the grouping at a graphical user interface, wherein displaying the grouping includes displaying only a first subset of violations while hiding other violations at a first time and, subsequently, incrementally displaying a second subset of violations that were not resolved after addressing the first subset of violations.

2. The computer-implemented method of claim 1, wherein the plurality of failures include at least one linting failure.

3. The computer-implemented method of claim 1, wherein a similar root cause corresponds to a portion of code.

4. The computer-implemented method of claim 1, wherein the check type includes a source location.

5. The computer-implemented method of claim 1, wherein displaying includes displaying an icon indicating the grouping.

6. The computer-implemented method of claim 1, wherein displaying includes displaying at least one of the one or more of the plurality of failures at an analysis browser.

7. A non-transitory computer-readable storage medium for electronic design verification, the computer-readable storage medium having stored thereon instructions that when executed by a machine result in one or more operations, the operations comprising:
   providing, using at least one processor, an electronic design;
   performing linting analysis using structural and formal methods of at least a portion of the electronic design;
   identifying a plurality of failures from the formal verification;
   identifying one or more of the plurality of failures as having a similar root cause;
   grouping the one or more of the plurality of failures together, wherein grouping is based upon, at least in part, a check type; and
   displaying the grouping at a graphical user interface, wherein displaying the grouping includes displaying only a first violation while hiding other violations at a first time and, subsequently, incrementally displaying a second subset of violations that were not resolved after addressing the first subset of violations.

8. The computer-readable storage medium of claim 7, wherein the plurality of failures include at least one linting failure.

9. The computer-readable storage medium of claim 7, wherein a similar root cause corresponds to a portion of code.

10. The computer-readable storage medium of claim 7, wherein the check type includes a source location.

11. The computer-readable storage medium of claim 7, wherein displaying includes displaying an icon indicating the grouping.

12. The computer-readable storage medium of claim 7, wherein displaying includes displaying at least one of the one or more of the plurality of failures at an analysis browser.

13. A system for use in a formal verification of an electronic design comprising:
a computing device having at least one processor configured to receive, using at least one processor, an electronic design, the at least one processor further configured to perform linting analysis using structural and formal methods of at least a portion of the electronic design, the at least one processor further configured to identify a plurality of failures from the formal verification and to identify one or more of the plurality of failures as having a similar root cause, the at least one processor further configured to group the one or more of the plurality of failures together, wherein grouping is based upon, at least in part, a check type, wherein the check type is selected from the group consisting of arithmetic checks, out of bound indexing, x-assignment unreachability, naming convention checks, clock checks and reset checks, the at least one processor further configured to display the grouping at a graphical user interface, wherein displaying the grouping includes displaying only a first subset of violations while hiding other violations at a first time and, subsequently, incrementally displaying a second subset of violations that were not resolved after addressing the first subset of violations.

14. The system of claim 13, wherein the plurality of failures include at least one linting failure.

15. The system of claim 13, wherein a similar root cause corresponds to a portion of code.

16. The system of claim 13, wherein the check type includes a source location.

17. The system of claim 13, wherein displaying includes displaying an icon indicating the grouping.

* * * * *